United States Patent [19]

Ludikhuize

[11] Patent Number: 4,750,028
[45] Date of Patent: Jun. 7, 1988

[54] SEMICONDUCTOR DEVICE HAVING FLOATING SEMICONDUCTOR ZONES

[75] Inventor: Adrianus W. Ludikhuize, Eindhoven, Netherlands

[73] Assignee: U. S. Philips Corporation, New York, N.Y.

[21] Appl. No.: 105,465

[22] Filed: Oct. 2, 1987

Related U.S. Application Data

[63] Continuation of Ser. No. 738,005, May 28, 1985, abandoned.

[30] Foreign Application Priority Data

Jun. 22, 1984 [NL] Netherlands ............. 8401983

[51] Int. Cl.$^4$ ........................... H01L 29/34
[52] U.S. Cl. ........................ 357/52; 357/20; 357/34; 357/36; 357/23.8; 357/55
[58] Field of Search ............... 357/20, 23.8, 34, 36, 357/52, 55

[56] References Cited

U.S. PATENT DOCUMENTS 4,573,066  2/1986  Whight ................. 357/52
4,602,266  7/1986  Coe ..................... 357/52

Primary Examiner—Edward J. Wojciechowicz
Attorney, Agent, or Firm—Jack Oisher; Steven R. Biren

[57] ABSTRACT

A semiconductor device has a surface zone which forms a planar pn junction with the surrounding substrate, this pn junction being biased in operation in the reverse direction. In order to increase the breakdown voltage, one or more floating zones are located beside the pn junction within the range of the depletion zone, which also form planar pn junctions with the substrate. According to the invention, the floating zones have an overall doping of at least $3 \cdot 10^{11}$ and at most $5 \cdot 10^{12}$ atoms/cm$^2$, as a result of which they are substantially depleted at a high reverse voltage.

6 Claims, 1 Drawing Sheet

SEMICONDUCTOR DEVICE HAVING FLOATING SEMICONDUCTOR ZONES

This is a continuation of application Ser. No. 738,005, filed May 28, 1985, now abandoned.

BACKGROUND OF THE INVENTION

The invention relates to a semiconductor device comprising a semiconductor body having a first zone of a first conductivity type adjoining a major surface of the body, a second zone of the second conductivity type which adjoins said major surface and which is bounded within the semiconductor body by the first zone and forms with it a pn junction terminating at said major surface, as well as at least one floating further zone of the second conductivity type having a substantially homogeneous depth. The further zone is located beside the second zone, adjoins said major surface and adjoins the first zone within the semiconductor body, and the distance of the further zone from the second zone is such that, when a sufficiently high reverse voltage is applied across the pn junction, the further zone is located entirely within the depletion zone thus obtained.

A "floating" zone is to be understood, as usual, to mean a semiconductor zone which is not connected to an external current or voltage source.

A semiconductor device of the kind described above is known from the article of Kao and Wolley in Proceedings I.E.E.E., Vol. 55, No. 8, August 1967, p. 1409–1414.

It is known that the breakdown voltage of a planar pn junction is in practice considerably lower than that which could be expected on account of the doping of the said first and second zones forming the pn junction. This is due to local increases of the field strength as a result of surface effects and especially also as a result of the edge curvature of the pn junction. According to the article of Kao and Wolley in Proc. I.E.E.E., these effects are considerably reduced by the presence of one or more floating further zones of the second conductivity type, which in the known device entirely laterally surround the second zone and are located within the range of the depletion zone of the pn junction. Due to these further zones, the reverse voltage across the pn junction is distributed over a considerably larger area, as a result of which the field strength is reduced accordingly.

In the known device, the further zones are provided simultaneously with the second zone and they therefore have the same depth and doping as this second zone. For shallow pn junctions, i.e. for those cases in which the second zone has only a small thickness, not only the edge curvature of the active pn junction, but also that of the pn junctions between the further zones and the first zone is substantial. Consequently, at the areas of the highest edge curvature on the outer side of the pn junctions between the first zone and the further zone or zones, high peaks in the field strength can nevertheless occur, as a result of which the breakdown voltage is reduced. Furthermore, the breakdown voltage depends in a fairly critical manner upon the doping and the mutual spacing of the further zones.

SUMMARY OF THE INVENTION

The invention has inter alia for its object to make the doping and the geometry of the floating further zones less critical than in the known device.

The invention is based inter alia on the recognition of the fact that the breakdown voltage becomes considerably less dependent upon the doping and the edge curvature of the further zones when, in the operating condition, the latter are depleted at least for a considerable part.

According to the invention, a semiconductor device of the kind described above is characterized in that the overall doping of the further zone is at least $3 \cdot 10^{11}$ atoms/cm$^2$ and at most $5 \cdot 10^{12}$ atoms/cm$^2$.

The "overall doping" of a zone is to be understood to mean the total number of doping atoms per unit surface area over the entire thickness of the zone.

According to the invention, the overall doping of the further zone or zones is considerably lower than that in known semiconductor devices, in which it generally is about $10^{14}$ atoms/cm$^2$ or higher. Due to this low doping, in the operating condition in which a reverse voltage is applied across the pn junction, the further zone is depleted for a substantial part at voltages lying considerably below the breakdown voltage. According to the so-called "Resurf" principle (see J. A. Appels et al., Philips Journal of Research, Vol. 35, No. 1, 1980, p. 1–13), the field strength is consequently reduced especially at the points having the highest edge curvature, so that higher voltages are permissible and hence both the doping and the distance between the second zone and the first further zone and the mutual distance between the further zones are less critical.

According to a preferred embodiment, the overall doping of the further zone (or further zones) is at least $8 \cdot 10^{11}$ and at most $2.5 \cdot 10^{12}$ atoms/cm$^2$. At normal operating voltages, the further zones in this case are depleted for more than 50%. With an overall doping of about $8 \cdot 10^{11}$ atoms/cm$^2$, the further zones are depleted at least locally throughout their thickness before the occurrence of breakdown so that with increasing voltage the depletion zone spreads mainly in the first zone. This first zone generally has a lower doping concentration in atoms per cm$^3$ than the further zone so that the field strength remains comparatively low.

The further zones may laterally surround the second zone. With the use of several further zones, each succeeding further zone may laterally entirely surround the preceding further zone. However in cases where a very high reverse voltage occurs only locally across the pn junction, the floating further zones may be provided, if desired, only at these areas. A very important case is that in which the pn junction is covered with an insulating layer on which, for example in an integrated circuit, a conductor track is disposed, which crosses the pn junction and of which the potential in the operating condition has the same sign with respect to that of the second zone as the potential of the first zone. Such a conductor track is generally disadvantageous because it increases the field strength where it crosses the pn junction. However, in the device according to the invention, it favors the depletion of the floating further zones and consequently the reduction of the maximum field strength.

In addition to the floating further zones, other supplementary field-reducing and passivating means may be present, such as, for example, field plates and the like.

BRIEF DESCRIPTION OF THE DRAWING

The invention will be described more fully with reference to several embodiments and the drawing, in which.

Figure 1:
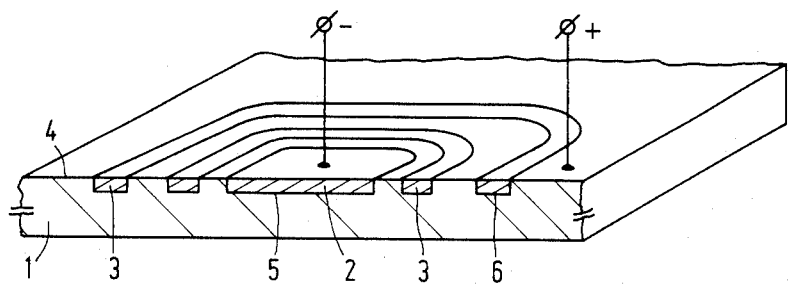
FIG. 1 shows diagrammatically, partly in cross-section and partly in perspective view, a device according to the invention.

The Figures are schematic and not drawn to scale, while in particular the dimensions in the direction of thickness are exaggerated. Corresponding parts are generally designated by the same reference numerals. In the cross-sections, semiconductor regions of the same conductivity type are cross-hatched in the same direction.

DESCRIPTION OF THE PREFERRED EMBODIMENTS

FIG. 1 shows diagrammatically, partly in cross-section and partly in perspective view, the structure of a semiconductor device according to the invention. The device comprises a semiconductor body, which in this embodiment consists of silicon, but may also consist of another semiconductor material. A first zone 1 of a first conductivity type, for example an n-type zone having a doping concentration, for example, of $10^{15}$ atoms/cm$^3$, adjoins a major surface 4 of the body. A second zone 2 of the second, opposite conductivity type (in this embodiment a p-type zone) also adjoining this major surface 4 is bounded within the semiconductor body by the first zone 1 of the n-conductivity type and forms with it a planar pn junction 5 terminating at the surface 4. The (average) doping concentration of the zone 2 is, for example, $10^{17}$ atoms/cm$^3$.

In order to increase the breakdown voltage of the pn junction 5, the device further comprises at least one floating further zone 3 of the second conductivity type (in this case p-type) having a substantially homogeneous thickness, which is located beside the second zone 2 and adjoins the surface 4. In this embodiment, two further zones 3 are provided (see FIGS. 1-4), which both adjoin within the semiconductor body the first zone 1 and form with it pn junctions 6. The distance of the further zones from the second zone 2 is such that, when a sufficiently high reverse voltage is applied across the pn junction 5, the further zones 3 are located within the depletion zone. See the detail section of FIG. 2, in which the boundaries of the depletion zone are indicated in dotted lines. In this embodiment, the further zones 3 have a width of about 6 μm. The distance of the second zone 2 from the first floating further zone 3 is 6 μm and the distance between the two zones 3 is in this embodiment also 6 μm. A first further zone with zero distance is also possible (cf FIG. 5)

Figure 2:
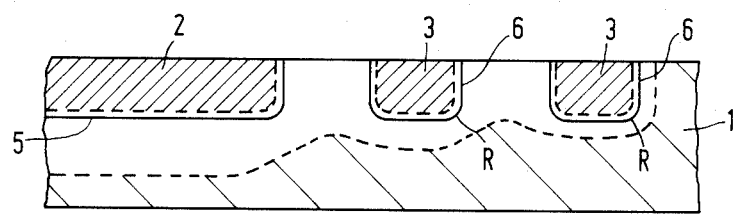
FIG. 2 shows diagrammatically in cross-section a part of the type of device shown in FIG. 1, FIGS. 3 and 4 show diagrammatically in cross-section parts of different devices according to the invention.

The semiconductor device described hitherto is known, as far as its general structure is concerned, from the aforementioned article of Kao and Wolley in Proceedings I.E.E.E., 1967, p. 1409–1414. FIG. 2 shows a detail section of the situation described in this article, in which the further zones 3 are formed simultaneously with the zone 2 and so have the same doping and thickness. The doping of the zones 3 is then such that the depletion zone extends only for a small part in the zones 3 and the overall depletion zone is so narrow at the areas of the highest edge curvature (indicated by R in FIG. 2) that the field strength in situ is comparatively high. As a result, especially in the case in which the zones 2 and 3 are fairly shallow and the said edge curvature is consequently high, breakdown can occur prematurely at the point R of the outer edge of the zones 3.

Figure 3:
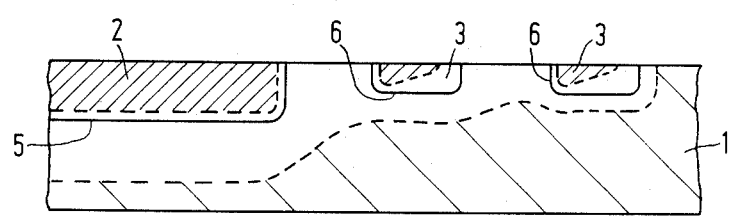
Figure 4:
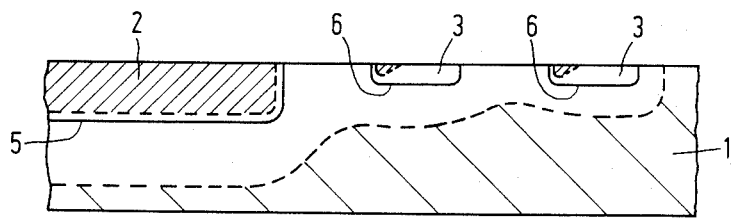

FIGS. 3 and 4 show the situation occurring in devices according to the invention. In such devices the overall doping of the further zones 3 is at least $3 \cdot 10^{11}$ and at most $5 \cdot 10^{12}$ atoms/cm$^2$. FIG. 3 shows the situation in which this doping is about $1.5 \cdot 10^{12}$ atoms/cm$^2$. It can be seen that in this case with a reverse voltage below the breakdown voltage the depletion zone (unshaded) extends over a considerable part of the further zones 3. Thus, the field strength is considerably reduced at the areas of the highest edge curvature so that the breakdown voltage is increased.

In FIG. 4, the situation is illustrated in which the overall doping of the zones 3 is about $8 \cdot 10^{11}$ atoms/cm$^2$. In this case, with a reverse voltage below the breakdown voltage, a considerable part of the zones 3 is entirely depleted. As a result, with a further increase of the reverse voltage, the depletion zone spreads substantially only in the region 1, which is comparatively weakly doped, which results in the field strength at the area of the points having the highest edge curvature being reduced even further.

In the devices shown in FIGS. 1, 2, 3 and 4, the second zone 2 is entirely surrounded laterally by the further zones 3. When an increased field strength occurs only locally along the pn junction 5, it is not necessary for the zones 3 to extend throughout the length of the pn junction 5. This is illustrated with reference to the following embodiment.

Figure 5:
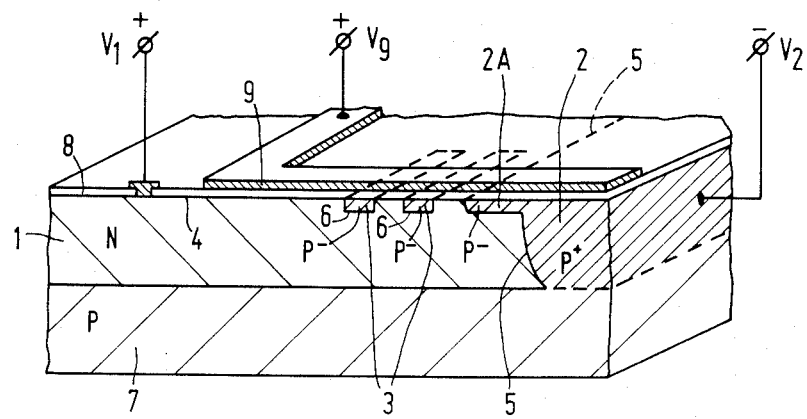
FIG. 5 shows diagrammatically in cross-section another device according to the invention.

FIG. 5 shows partly in cross-section and partly in perspective view a part of an integrated circuit, in which the first zone 1 is an n-type island, in which one or more semiconductor circuit elements (not shown here) are disposed. The island is constituted by a part of an epitaxial layer, which is located on a p-type substrate 7. The second zone 2 is a p-type isolation region adjoining the substrate 7 and laterally bounding the island 1. The region 2 has a more weakly doped protuberance 2A adjoining the surface 4.

The surface 4, and hence also the pn junction 5 at the area at which it intersects the surface, is covered by an electrically insulating layer 8, for example a 1 μm thick layer of silicon oxide. The pn junction 5 (indicated in FIG. 5 by dotted lines at the surface 4) is crossed by a conductor track 9, which is located on the insulating layer 8 and whose potential $V_9$ in the operating condition has the same sign with respect to that ($V_2$) of the second zone 2 as the potential $V_1$ of the first zone 1 (see FIG. 5). The conductor track 9 may be a supply line or a connection between two semiconductor circuit elements; the potentials $V_1$, $V_2$ and $V_9$ are indicated for illustration in FIG. 5 purely schematically and may be obtained in different ways. In this case it is only of importance that in the operating condition $V_1$ and $V_9$ have the same sign as each other with respect to $V_2$ at a given instant.

In this situation, at the area at which the conductor 9 (for example a metal track) crosses the pn junction 5, the electric field at the reverse-biased pn junction 5 is additionally increased, as a result of which breakdown can occur prematurely. In order to avoid this, at such areas (also indicated in FIG. 5), the isolation diffusion 2 is often provided with a high-ohmic protuberance 2A, which in the operating condition is depleted for a considerable part, as a result of which the surface field strength is reduced, according to the aforementioned "RESURF" principle. When this protuberance 2A projects too far (as a result of which the edge of the protuberance is located below a conductor part having an excessively high voltage due to the voltage drop across the conductor track 9), or when the doping of the protuberance is slightly too high, the field at the point of the highest edge curvature becomes so strong that at this area nevertheless breakdown occurs prematurely. In order to avoid this, one or more floating further zones 3 can be provided beside the zone 2, which essentially need be present only at the vulnerable area, in this case consequently in the vicinity of the crossing with the conductor track; see FIG. 5. The zones 3 according to the invention have an overall doping of at least $3 \cdot 10^{11}$ and at most $5 \cdot 10^{12}$ atoms/cm$^2$. Since in this case the depletion takes place from two sides, i.e. from the lower side of the zones 3 through the pn junctions 6 connected in the reverse direction and from the upper side through the conductor track 9, the doping of the zones 3 may in this case be slightly higher than would be the case in the absence of the conductor 9.

The structures described can be manufactured by the use of conventional techniques. The second zone 2 may be formed by diffusion, by ion implantation or in a different manner. The "floating" further zones 3 are preferably formed by ion implantation in view of their comparatively low doping and also due to the fact that by ion implantation both the overall doping in atoms/cm$^2$ and the depth of the floating zones are satisfactorily controllable and reproducible. In the embodiment of FIG. 5, the floating zones 3 are preferably implanted simultaneously with the protuberance 2A.

The dopings and thicknesses used for the various semiconductor regions and their geometry may be varied by those skilled in the art within wide limits without leaving the scope of the invention. The structure according to the invention may further be used in a great variety of different discrete or integrated semiconductor devices. In the embodiments shown, the conductivity types may be replaced (all simultaneously) by the opposite conductivity types while the voltages applied are simultaneously reversed. Furthermore, of course also semiconductor materials other than silicon may be used.

The semiconductor device according to the invention may finally comprise, as already stated, further supplementary field-reducing and passivating means. Thus, for example, in the device shown in FIG. 5, field plates may be arranged outside and besides the floating zones 3 in order to reduce the electric field at vulnerable areas. Furthermore, in FIGS. 3 and 4, the zone 2 may be provided with depleting protuberances analogous to the protuberance 2A in FIG. 5. The invention may be used not only in bipolar devices, but, for example, also for increasing the drain-breakdown voltage in field effect transistors.

What is claimed is:

1. A semiconductor device comprising a semiconductor body having a major surface and a first zone of a first conductivity type adjoining said major surface, a second zone of the second, opposite conductivity type which adjoins said major surface and which is bounded within the semiconductor body by the first zone and forms with it a pn junction terminating at said major surface, and at least one floating further zone of the second conductivity type having a substantially constant depth, which further zone is located beside the second zone, adjoins said major surface and is entirely surrounded by the first zone within the semiconductor body, the distance of the further zone from the second zone being such that, when a sufficiently high reverse voltage is applied across the pn junction, the further zone is located entirely within the depletion zone thus obtained, the overall doping of the further zone being at least $3 \times 10^{11}$ atoms/cm$^2$ and at most $5 \times 10^{12}$ atoms/cm$^2$ so that the further zone is depleted for a substantial part at said voltage.

2. A semiconductor device as claimed in claim 1, characterized in that the overall doping of the further zone is at least $8 \times 10^{11}$ and at most $2.5 \times 10^{12}$ atoms/cm$^2$.

3. A semiconductor device as claimed in claim 1 or 2, further comprising an electrically insulating layer covering said pn junction and a conductor track which is located on the insulating layer and whose potential in the operating condition has the same sign with respect to that of the second zone as the potential of the first zone, said conductor track crossing over said pn junction.

4. A semiconductor device as claimed in claim 1 or 2, characterized in that the further zone laterally surrounds the second zone within the semiconductor body.

5. A semiconductor device as claimed in claim 1 or 2, characterized in that a plurality of further zones are provided, each succeeding further zone lying at a larger distance from the second zone than the preceding further zone.

6. A semiconductor device as claimed in claim 5, characterized in that each succeeding further zone laterally surrounds the preceding further zone.

* * * * *